United States Patent
Jiang (10) Patent No.: US 8,536,538 B2
(45) Date of Patent: Sep. 17, 2013

(54) MULTIPLE-POLE ELECTROSTATIC DEFLECTOR FOR IMPROVING THROUGHPUT OF FOCUSED ELECTRON BEAM INSTRUMENTS

(75) Inventor: Xinrong Jiang, Palo Alto, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 224 days.

(21) Appl. No.: 13/028,444

(22) Filed: Feb. 16, 2011

(65) Prior Publication Data
US 2012/0205537 A1 Aug. 16, 2012

(51) Int. Cl.
*G21K 5/04* (2006.01)
*H01J 37/26* (2006.01)

(52) U.S. Cl.
USPC ....... 250/396 R; 250/306; 250/307; 250/310; 250/311

(58) Field of Classification Search
USPC ............. 250/306, 307, 309, 310, 311, 396 R, 250/397, 398, 396 ML
See application file for complete search history.

(56) References Cited

U.S. PATENT DOCUMENTS

| | | | |
|---|---|---|---|
| 5,994,709 A | 11/1999 | Suzuki | |
| 6,989,546 B2 | 1/2006 | Loschner et al. | |
| 7,473,905 B2 | 1/2009 | Goto | |
| 2004/0227099 A1* | 11/2004 | Matsuya | 250/398 |
| 2008/0283749 A1* | 11/2008 | Muller et al. | 250/311 |
| 2009/0039281 A1* | 2/2009 | Kawasaki et al. | 250/396 R |

FOREIGN PATENT DOCUMENTS
JP 2009-170322 7/2009

OTHER PUBLICATIONS
PCT International Search Report for Application No. PCT/US2012/023128, Sep. 5, 2012, 3 sheets.

* cited by examiner

*Primary Examiner* — Robert Kim
*Assistant Examiner* — Nicole Ippolito
(74) *Attorney, Agent, or Firm* — Okamoto & Benedicto LLP (57) ABSTRACT

One embodiment relates to a focused electron beam imaging apparatus. The apparatus includes an electron beam column, an electron source, a gun lens, a pre-scanning deflector, a main scanning deflector, an objective lens, and a detector. The pre-scanning deflector comprises a 12-pole electrostatic deflector which is configured to controllably deflect the electron beam away from the optical axis of the electron beam column. Another embodiment relates to a method of scanning an electron beam over a target substrate in a focused electron beam imaging instrument. The electron beam is controllably deflected, without third-order deflection aberrations, away from an optical axis of an electron beam column using a pre-scanning deflector. The electron beam is then controllably deflected back towards the optical axis using a main scanning deflector so that the electron beam passes through a center of an objective electron lens. Other embodiments, aspects and features are also disclosed.

3 Claims, 10 Drawing Sheets

FIG. 10
(Conventional)

MULTIPLE-POLE ELECTROSTATIC DEFLECTOR FOR IMPROVING THROUGHPUT OF FOCUSED ELECTRON BEAM INSTRUMENTS

BACKGROUND OF THE INVENTION

1. Field of the Invention

The present invention relates to apparatus and methods for electron beam imaging.

2. Description of the Background Art

A Focused Electron Beam (FEB) may be used to create and/or examine the microstructure of articles. A common article of interest is a silicon wafer used for the manufacture of microelectronics. The FEB formed with the electrons emitted from an emitter in an electron gun is a fine probe when it interacts with the wafer for examining microstructures. The fine electron probe may be driven by a deflection system, thereby scanning over a wafer for microstructure examination.

SUMMARY

One embodiment relates to a focused electron beam imaging apparatus. The apparatus includes an electron beam column, an electron source, a gun lens, a pre-scanning deflector, a main scanning deflector, an objective lens, and a detector. The pre-scanning deflector comprises a 12-pole electrostatic deflector which is configured to controllably deflect the electron beam away from the optical axis of the electron beam column.

Another embodiment relates to a method of scanning an electron beam over a target substrate in a focused electron beam imaging instrument. The electron beam is controllably deflected, without third-order deflection aberrations, away from an optical axis of an electron beam column using a pre-scanning deflector. The electron beam is then controllably deflected back towards the optical axis using a main scanning deflector so that the electron beam passes through a center of an objective electron lens.

Another embodiment relates to a twelve-pole electrostatic deflector which includes twelve electrode plates attached to a cylindrical interior of an insulator. The twelve electrode plates may be arranged as follows going counterclockwise in a top view down the axis of the cylindrical interior. The first electrode plate spans a radial angle of $2\alpha_1$, and a first gap follows the third electrode plate. The second electrode plate follows the first gap and spans a radial angle of $\alpha_2$, and a second gap follows the third electrode plate. The third electrode plate with a radial angle of $\alpha_2$ follows the second gap, and a third gap follows the third electrode plate. The fourth electrode plate with radial angle of $2\alpha_1$ follows the third gap, and a fourth gap follows the fourth electrode plate. The fifth electrode plate with a radial angle of $\alpha_2$ follows the fourth gap, and a fifth gap follows the fifth electrode plate. The sixth electrode plate with a radial angle of $\alpha_2$ follows the fifth gap, and a sixth gap follows the sixth electrode plate. The seventh electrode plate with radial angle of $2\alpha_1$ follows the sixth gap, and a seventh gap follows the seventh electrode plate. The eighth electrode plate with a radial angle of $\alpha_2$ follows the seventh gap, and an eighth gap follows the eighth electrode plate. The ninth electrode plate with a radial angle of $\alpha_2$ follows the eighth gap, and a ninth gap follows the ninth electrode plate. The tenth electrode plate with radial angle of $2\alpha_1$ follows the ninth gap, and a tenth gap follows the tenth electrode plate. The eleventh electrode plate with a radial angle of $\alpha_2$ follows the tenth gap, and an eleventh gap follows the eleventh electrode plate. The twelfth electrode plate with a radial angle of $\alpha_2$ follows the eleventh gap, and a twelfth gap follows the twelfth electrode plate. Each aforementioned gap has a radial angle of $2\delta$.

Other embodiments, aspects and features are also disclosed.

DETAILED DESCRIPTION

The throughput for examining a wafer by an FEB instrument is gated by the total time used to complete the examination of an entire wafer (or a die in a wafer). The total time consists of the total pixel dwell time, total scan retrace time and total stage turnaround time. The total pixel dwell time is gated by the beam current used for the wafer examination. Generally, the total dwell time may be shorter if the beam current is higher. The scan retrace time and stage turnaround time are each determined, in part, by the Field Of View (FOV) of the scanning system in the FEB instrument. In general, the larger the FOV, the shorter the retrace time and stage turnaround time will be.

Applicant has determined that, in order to increase the throughput of an FEB instrument, it is desirable to improve the design of the deflection system of the FEB instrument to provide a high level of image uniformity across the scanning area of a large FOV. The present patent application discloses apparatus and methods to enlarge the FOV of an FEB instrument while maintaining a high level of image uniformity across the FOV.

Figure 1:
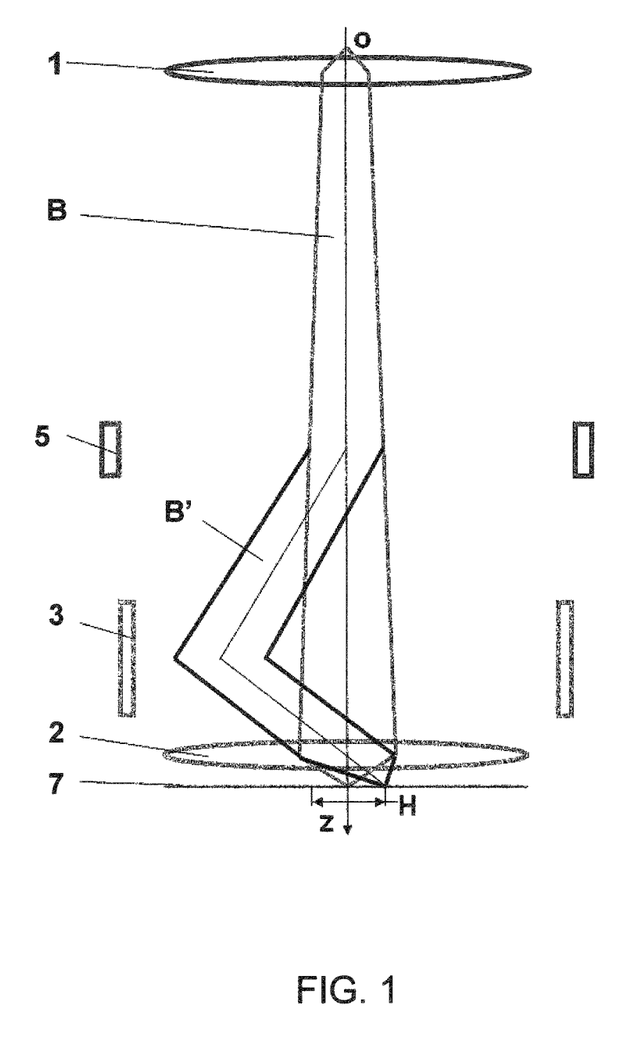
FIG. 1 is an electron-optical ray diagram of an electron beam column of a FEB image-forming instrument in accordance with an embodiment of the invention.

FIG. 1 is an electron-optical ray diagram of an electron beam column of a FEB image-forming instrument in accordance with an embodiment of the invention. The FEB instrument of FIG. 1 utilizes a two-lens image-forming system. As shown in FIG. 1, the gun lens (1) focuses the electrons from the emitter (o) to form the electron beam (e-beam) (B) which is directed down the optical axis (z) of the column, and the objective lens (2) with a short working distance further focuses the e-beam (B) onto the target wafer (7).

The FEB column may include a scanning system that utilizes a dual-deflector electrostatic deflection system for high-speed scanning to reduce the pixel dwell time. The dual-deflector scanning system includes a pre-scanning deflector ("pre-scanner") (5) and a main scanning deflector ("main scanner") (3) and may be deployed in between the gun lens (1) and objective lens (2).

The electron beam (B) is first deflected by the pre-scanner (5) to form the deflected beam (B'). The deflected beam (B') is then deflected back by the main scanner (3) to pass through the center of the objective lens (2) to minimize the deflection aberrations (off-axis aberrations). In the dual-deflector scanning system, there may be an optimized deflection strength relation and an optimized deflecting direction relation between the pre-scanner (5) and main scanner (3), at which the deflection aberrations are minimized. In accordance with one embodiment of the invention, the main scanner (3) may comprise a quadrupole electrostatic deflector which is described below in relation to FIGS. 3 and 4, and the pre-scanner (5) may comprise a 12-pole electrostatic deflector which is described below in relation to FIGS. 5 and 6.

The scan FOV may be a frame scan area or a swath scan height, H, as shown in FIG. 1. A swath scan may be used in, for instance, wafer electron-beam inspection applications. The deflection aberrations may be measured in terms of coma, field curvature and astigmatism. The coma is directly proportional to the swath scan height H, and the field curvature and astigmatism are directly proportional to H squared.

Figure 2:
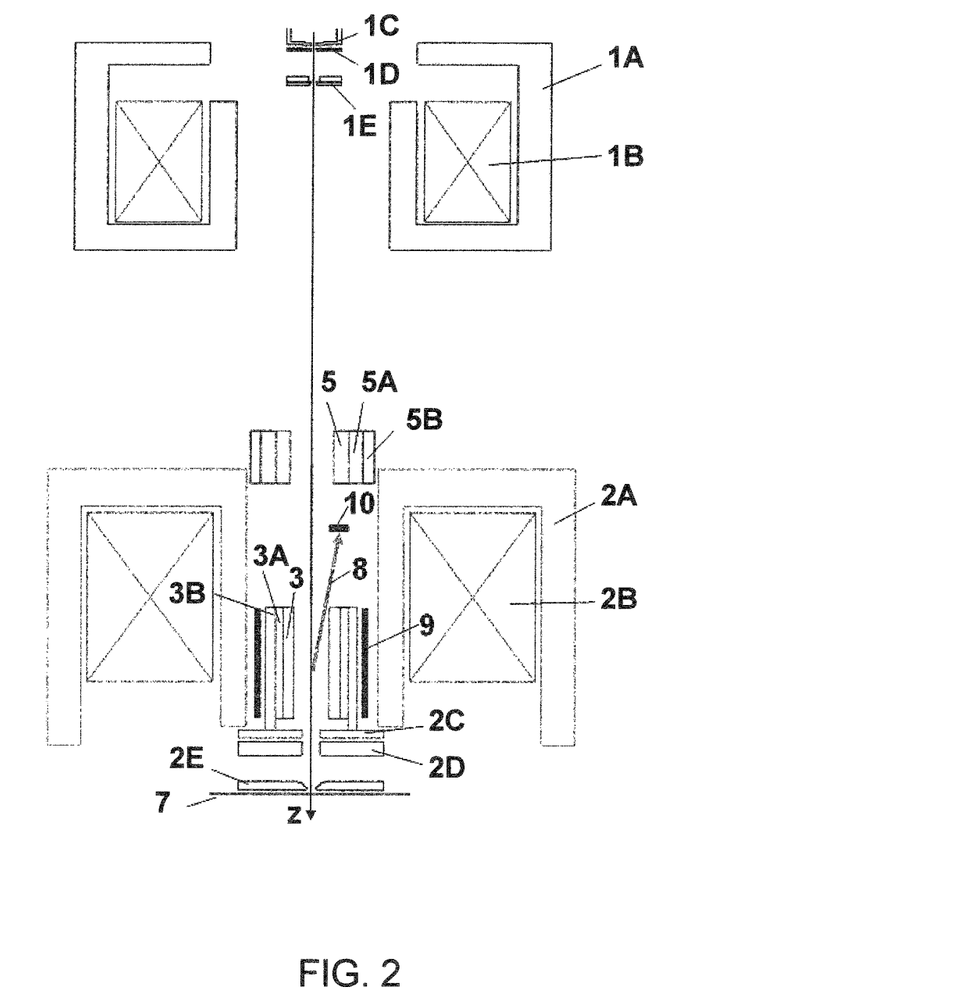
FIG. 2 is a cross-sectional diagram depicting select components of the electron beam column of a FEB image-forming instrument in accordance with an embodiment of the invention.

FIG. 2 is a cross-sectional diagram depicting select components of the electron beam column of an FEB image-forming instrument in accordance with an embodiment of the invention. The magnetic section of the gun lens (1) in FIG. 1 may be formed by a magnetic pole piece (1A) and a coil (1B), and the electrostatic section of the gun lens (1) may be formed by an electron emitter (1C), an extractor electrode (1D) and an anode electrode (1E).

The magnetic section of the objective lens (2) may include a magnetic pole piece (2A) and a coil (2B), and the electrostatic section of the objective lens (2) may include a ground electrode (2C), a fast focus electrode (2D), a wafer charge-control plate (2E) and the wafer (7). Both the gun lens and the objective lens are magnetic-field-immersed lenses.

Figure 3:
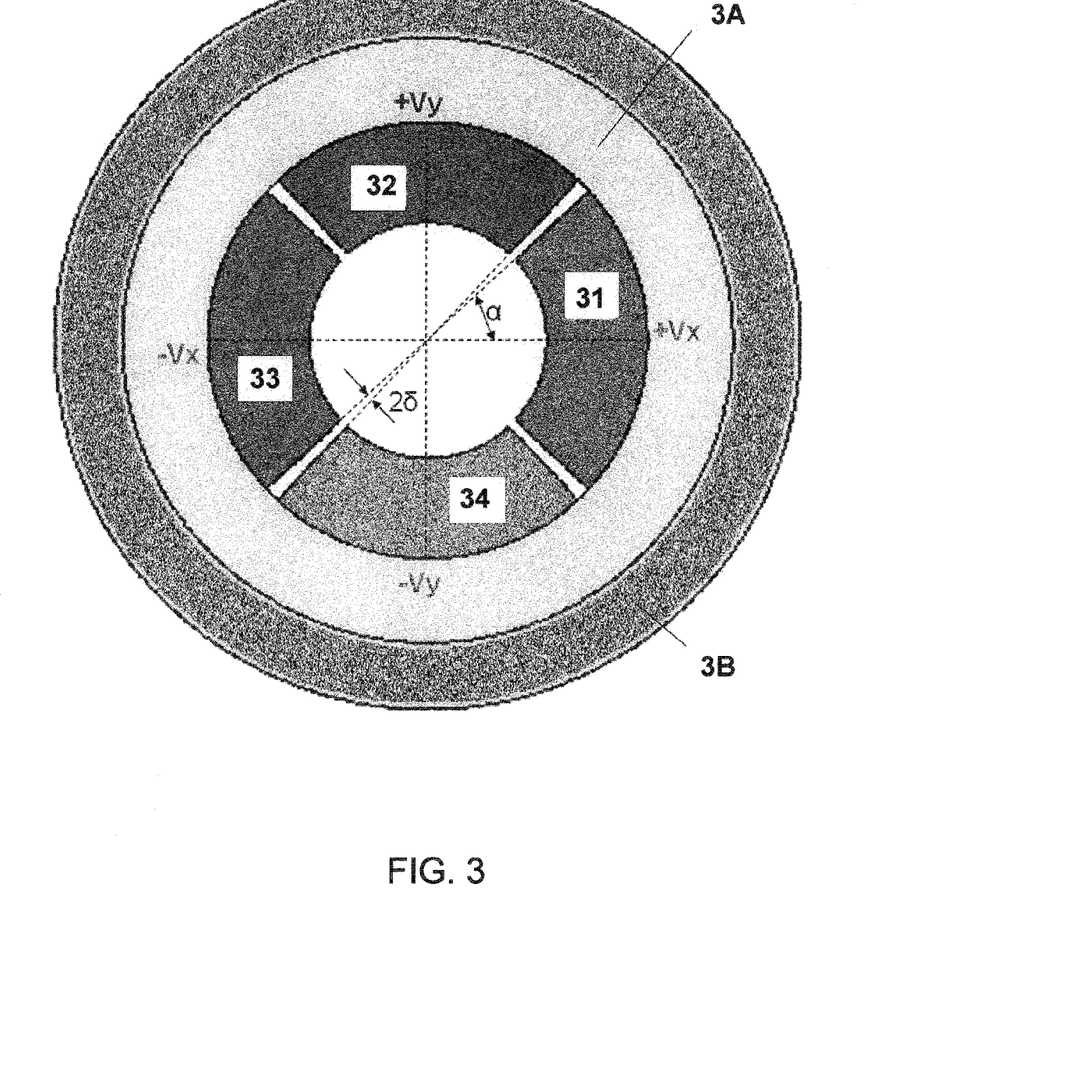
FIG. 3 is a top-down view of a quadrupole electrostatic deflector which may be used for a main scanning deflector in accordance with an embodiment of the invention.

In this embodiment, the main scanner (3) for xy-plane scanning may be a quadrupole electrostatic deflector, as shown in FIG. 3, in which four electrode plates (31, 32, 33 and 34) are electrically driven by four scan signal supplies (+Vx, −Vx, +Vy and −Vy). The four electrode plates are fixed at a cylindrical insulator (3A) and a cylindrical ground shield (3B) is arranged around the insulator (3A). The ground shield may comprise an electrically grounded metal. The four plates angles to the center are each defined by angle $\alpha$ and $\alpha_2$, and the gap angle between plates is defined by $2\delta$.

As indicated in FIG. 3, a first scan signal voltage supply applies the voltage signal +Vx to a first electrode plate 31. A second scan signal voltage supply applies the voltage signal +Vy to a second plate 32. A third scan signal voltage supply applies the voltage signal −Vx to a third electrode plate 33, the third plate 33 being positioned opposite to the first plate 31. A fourth scan signal voltage supply applies the voltage signal −Vy to a fourth electrode plate 34, the fourth plate 34 being positioned opposite to the second plate 32.

Figure 4:
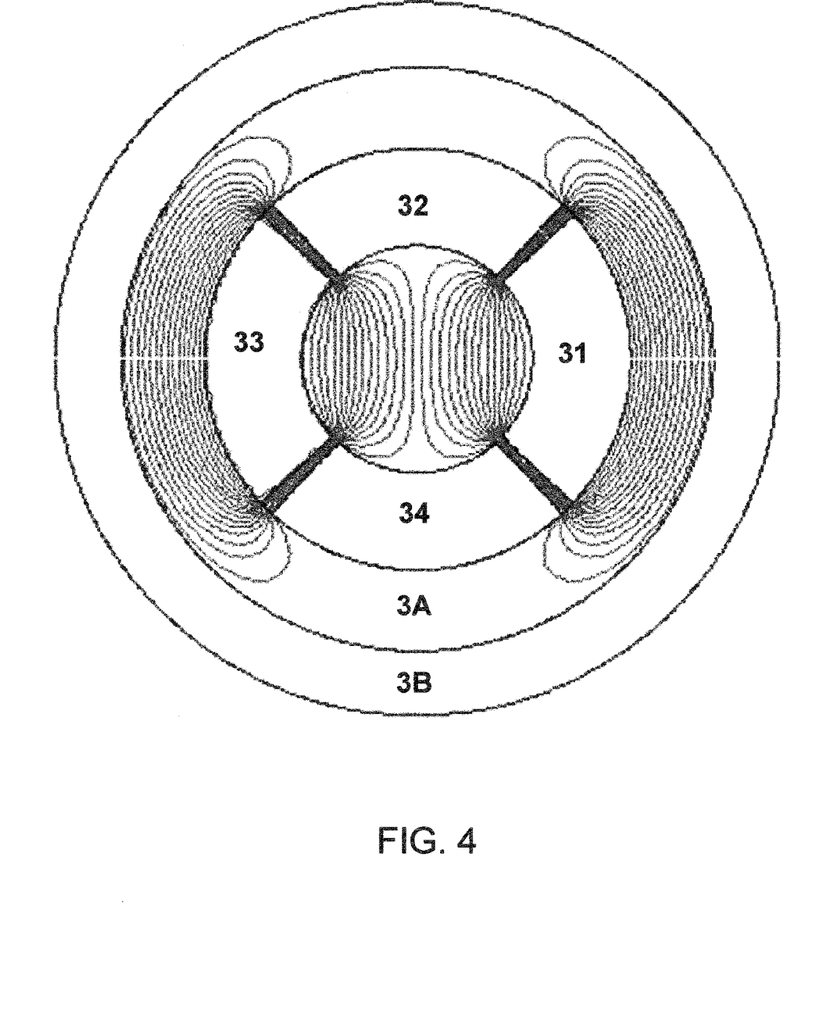
FIG. 4 depicts an equipotential distribution for the quadrupole electrostatic deflector of FIG. 3 as generated by applicant's computer simulation.

FIG. 4 depicts an equipotential distribution for the quadrupole electrostatic deflector of FIG. 3 as generated by applicant's computer simulation. In order to examine the deflection field homogeneity along the x-axis, the simulation assumed Vx=1 volt (i.e. +Vx=+1 volt and −Vx=−1 volt) and Vy=0 volts (i.e. +Vy=−Vy=0 volts).

The computer-simulated equipotential distribution of FIG. 4 shows that there is non-homogeneity in the central area of the quadrupole deflector. This is shown by the non-uniform spacing between equipotential lines in the central area. The inhomogeneous deflection field causes off-axis aberrations (deflection aberrations) of coma, field curvature and astigmatism. While the field curvature and astigmatism may be corrected in the FEB instrument, the coma is generally uncorrectable. The coma is, accordingly, largely responsible for the degradation in image uniformity across the scanning FOV. Moreover, the coma due to the inhomogeneous deflection field is directly proportional to the beam current and the FOV size (for example, the swath scan height, H). This effectively limits the throughput of the FEB instrument since beam current and FOV size are important factors that directly affect the throughput.

Due to the aforementioned inhomogeneous deflection field of the quadrupole electrostatic deflector, applicant has determined that it is preferable to implement at least the pre-scanner (5) using a deflector with a more uniform deflection field. More particularly, applicant has determined that the pre-scanner (5) is preferably implemented with a multi-pole electrostatic scanner which is configured to eliminate third-order aberrations.

Consider for simplicity that the deflection Vx is on while Vy is zero. The potential distribution in the quadrupole electrostatic deflector may then be expressed as the following series.

$$\varphi(r, \theta) = \sum_{k=1,3,5,\ldots}^{\infty} r^k A_k \cos k\theta = rA_1\cos\theta + r^3 A_3\cos3\theta + r^5 A_5\cos5\theta + \ldots \quad (1)$$

As seen above in Equation (1), for the quadrupole electrostatic deflector, the non-zero constants are $A_k$, where k=1, 3, 5, and so on.

The values of the constants $A_k$ in the series are determined by the boundary condition at r=R. As such, the constants $A_k$ may be expressed as follows.

$$A_k = \frac{1}{\pi R^k} \int_{-\pi}^{\pi} \varphi(R, \theta)\cos k\theta d\theta \quad (2)$$

While the first-order (k=1) term represents the primary field that causes the desired deflection of the electron beam, the third-order (k=3) and higher-order terms are responsible for aberrations in the deflection field.

Figure 5:
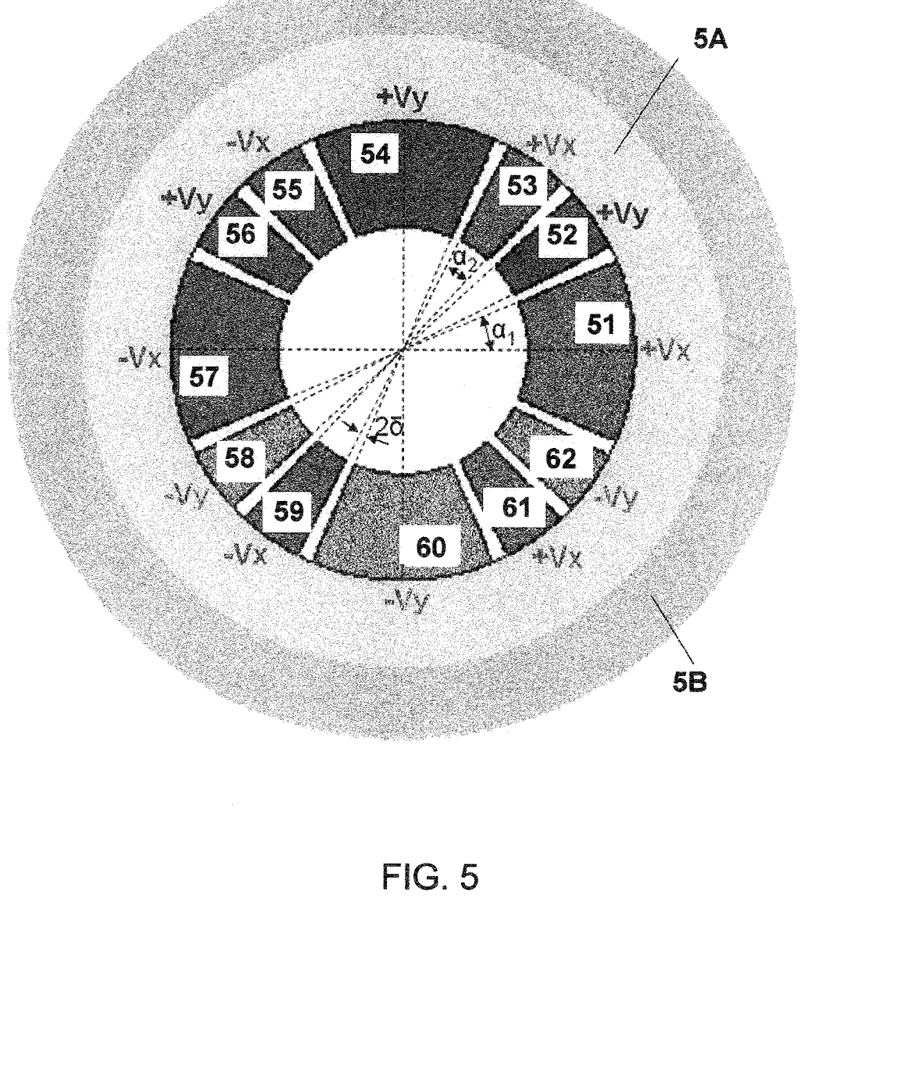
FIG. 5 is a top-down view of a 12-pole electrostatic deflector which may be used for a pre-scanning deflector in accordance with an embodiment of the invention.

The higher-order deflection aberrations caused by the higher-order terms (k>3) in Eq. (1) are normally considerably small and negligible. Consequently, the Eq. (1) for the 12-pole deflector in FIG. 5 is approximately given by $$\phi(r,\theta) \approx rA_1 \cos\theta \quad (3)$$

or, $$\phi(x,y) \approx A_1 x \quad (4)$$

in which $$A_1 = \rho \frac{V_x}{R} \frac{\sin\delta}{\delta} \quad (5)$$

and $$\rho = \frac{4}{\pi}[\sin(\alpha_1 + 2\alpha_2 + 5\delta) - \sin(\alpha_1 + \alpha_2 + 3\delta) + \sin(\alpha_1 + \delta)] \quad (6)$$

The $\rho$ in Eq. (6) is referred to as the coefficient of the deflection field of the 12-pole electrostatic deflector. The $\rho$ is equal to 0.79 when $\alpha_1=23°$, $\alpha_2=16°$ and $\delta=2°$.

The electrical field for the deflection in the x-axis is defined by the $1^{st}$-order constant $A_1$, i.e.

$$E_x = -\frac{\partial \varphi(x,y)}{\partial x} = -A_1 = -0.79 \frac{\sin\delta}{\delta} \frac{V_x}{R} \quad (7)$$

Applicant has determined that the third-order term of the series in Equation (1) may be effectively zero in particular multiple-pole electrostatic deflector designs taught by the present disclosure. In accordance with an embodiment of the invention, the pre-scanner (5) for xy-plane scanning may be implemented using such a design.

A design for a 12-pole electrostatic deflector with near zero $3^{rd}$-order aberrations is described as follows in relation to FIGS. 5 and 6. FIG. 5 depicts applicant's design for a 12-pole electrostatic deflector in which twelve electrode plates (51, 52, 53, 54, 55, 56, 57, 58, 59, 60, 61 and 62) are electrically driven by four scan signal voltage supplies (+Vx, -Vx, +Vy and -Vy). The twelve electrode plates are fixed inside a cylindrical insulator (5A) and a cylindrical ground shield (5B) is arranged around the insulator (5A). The ground shield may comprise an electrically grounded metal.

In counterclockwise order, the electrode plates are 51, 52, 53, 54, 55, 56, 57, 58, 59, 60, 61 and 62. The twelve plates are mechanically symmetric across the x-axis and across the y-axis. The twelve plate angles to the center are not equal and defined by angles $\alpha_1$ and $\alpha_2$. As seen in FIG. 5, the plate angle (angular extent) is $2\alpha_1$ for each of the four larger electrode plates 51, 54, 57 and 60, and the plate angle (angular extent) is $\alpha_2$ for each of the eight smaller electrode plates 52, 53, 55, 56, 58, 59, and 60. The gap angle between each pair of adjacent electrode plates is set to be $2\delta$.

The first larger electrode plate 51 is centered on $\theta=0$ such that it spans the angular range from $\theta=+\alpha_1$ to $\theta=-\alpha_1$. The second larger electrode plate 54 is centered on $\theta=\pi/2$ such that it spans the angular range from $\theta=\pi/2+\alpha_1$ to $\theta=\pi/2-\alpha_1$. The third larger electrode plate 57 is centered on $\theta=\pi$ such that it spans the angular range from $\theta=\pi+\alpha_1$ to $\theta=\pi-\alpha_1$. Finally, the fourth larger electrode plate 60 is centered on $\theta=3\pi/2$ such that it spans the angular range from $\theta=3\pi/2+\alpha_1$ to $\theta=3\pi/2-\alpha_1$.

As indicated in FIG. 5, a first scan signal voltage supply applies the voltage signal +Vx to the three electrode plates 51, 53 and 61. A second scan signal voltage supply applies the voltage signal -Vx to the three electrode plates 55, 57 and 59. A third scan signal voltage supply applies the voltage signal +Vy to the three electrode plates 52, 54 and 56. A second scan signal voltage supply applies the voltage signal -Vy to the three electrode plates 58, 60 and 62.

In a particular embodiment of the invention, given the condition that the half gap angle $\delta=2$ degrees, the first plate angle $\alpha_1=23$ degrees, and the second plate angle $\alpha_2=16$ degrees. With these particular angles, the third-order term of the deflection field may be eliminated (or nearly eliminated) for the 12-pole electrostatic deflector of FIG. 5.

Figure 6:
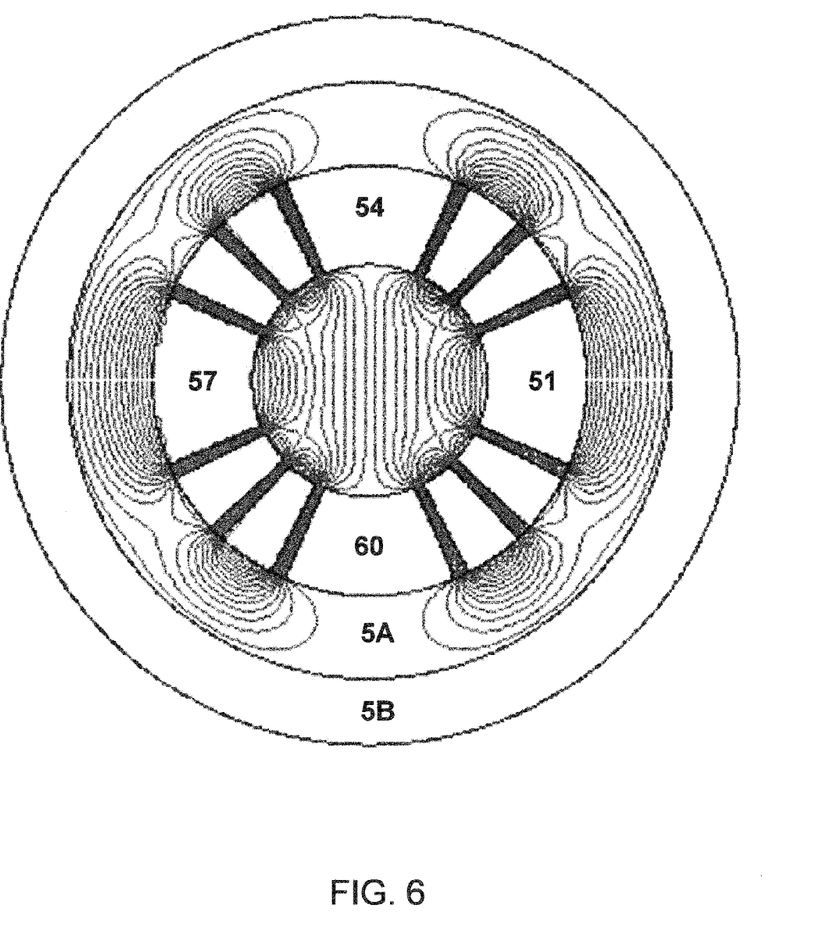
FIG. 6 depicts an equipotential distribution for a particular embodiment of the 12-pole electrostatic deflector of FIG. 5 as generated by applicant's computer simulation.

FIG. 6 depicts an equipotential distribution for the particular embodiment of the 12-pole electrostatic deflector of FIG. 5 as generated by applicant's computer simulation. As described above, for the simulation, $\delta=2$ degrees; $\alpha_1=23$ degrees; and $\alpha_2=16$ degrees. In order to examine the deflection field homogeneity along the x-axis, the simulation assumed Vx=1 volt (i.e. +Vx=+1 volt and -Vx=-1 volt) and Vy=0 volts (i.e. +Vy=-Vy=0 volts).

The computer-simulated equipotential distribution of FIG. 6 shows that there is much improved homogeneity in the central area of the quadrupole deflector. This is shown by the more uniform spacing between equipotential lines in the central area. The more homogeneous deflection field reduces off-axis aberrations (deflection aberrations) of coma, field curvature and astigmatism. In particular, the aberrations caused by coma is reduced. Advantageously, the reduced amount of coma enable the beam current and FOV size to be increased, which allows for increased throughput of the FEB instrument.

Referring back to FIG. 2, the main-scanner (3) together with a pair of yoke coils (9) may form a Wien filter to deflect the signal electrons (8) to the detector (10). The detector (10) is used to collect examination signals (secondary electrons and/or back-scatted electrons) from the semiconductor wafer (or other manufactured substrate) to form the FEB scanning image.

Figure 7:
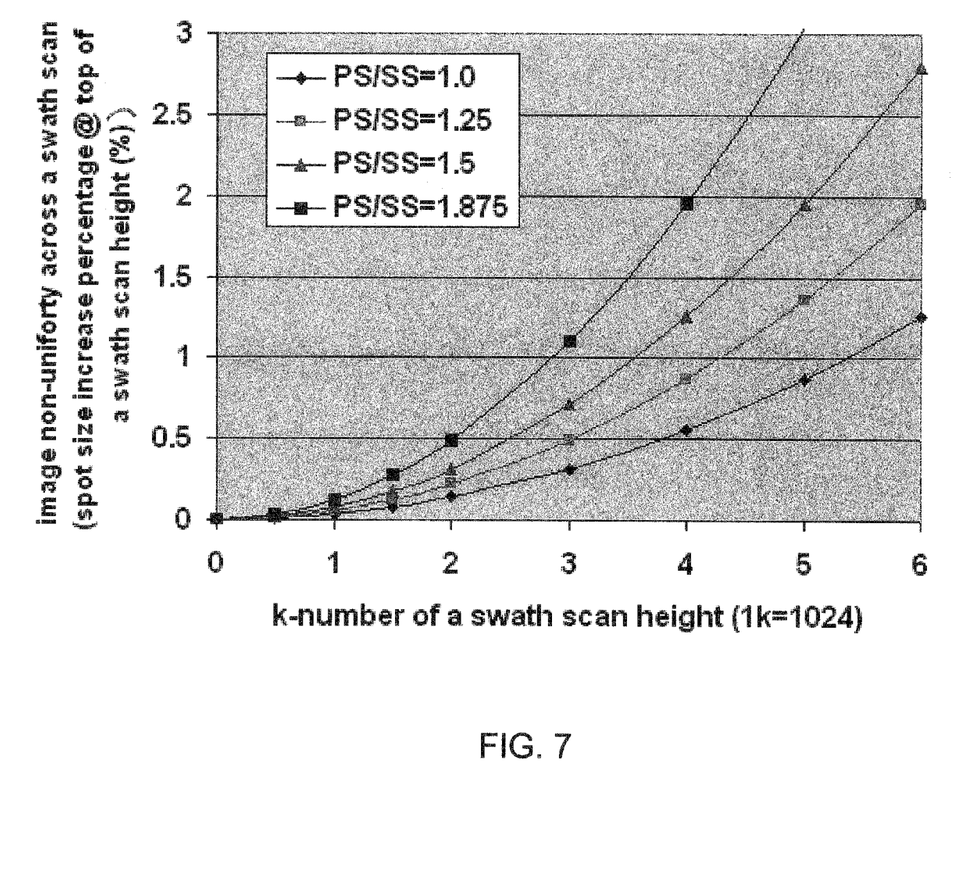
FIG. 7 is graph showing image non-uniformity data based on electron-beam simulations for the apparatus described in relation to FIGS. 1-6.

FIG. 7 is graph showing image non-uniformity data based on electron-beam simulations for the apparatus described above in relation to FIGS. 1-6. In other words, the simulations results of FIG. 7 are based on an apparatus which uses a 12-pole electrostatic deflector as a pre-scanning deflector and a quadrupole electrostatic deflector as a main scanning deflector.

The image non-uniformity data in FIG. 7 is calculated for four ratios of Pixel_Size (PS) over Spot_Size (SS): PS/SS=1.0; PS/SS=1.25; PS/SS=1.5; and PS/SS=1.875. For each ratio PS/SS, the percent increase in spot size from the field center (center of the FOV) to the top edge of a swath scan is plotted for swath scans with various swath scan heights. A swath scan height (i.e. the deflection distance H in FIG. 1) may be defined by H=Number_of_Pixels×Pixel_Size. The number of pixels may be defined by Number_of_Pixels=k-number×1024.

As indicated in the data of FIG. 7, the spot size increase across a swath scan is less than five percent. This is quite low and indicates a high-level of image uniformity.

While the image uniformity results are quite good for the apparatus described above in relation to FIGS. 1-6, they may be further improved by using two 12-pole electrostatic deflectors. Such an embodiment is depicted in FIG. 8.

Figure 8:
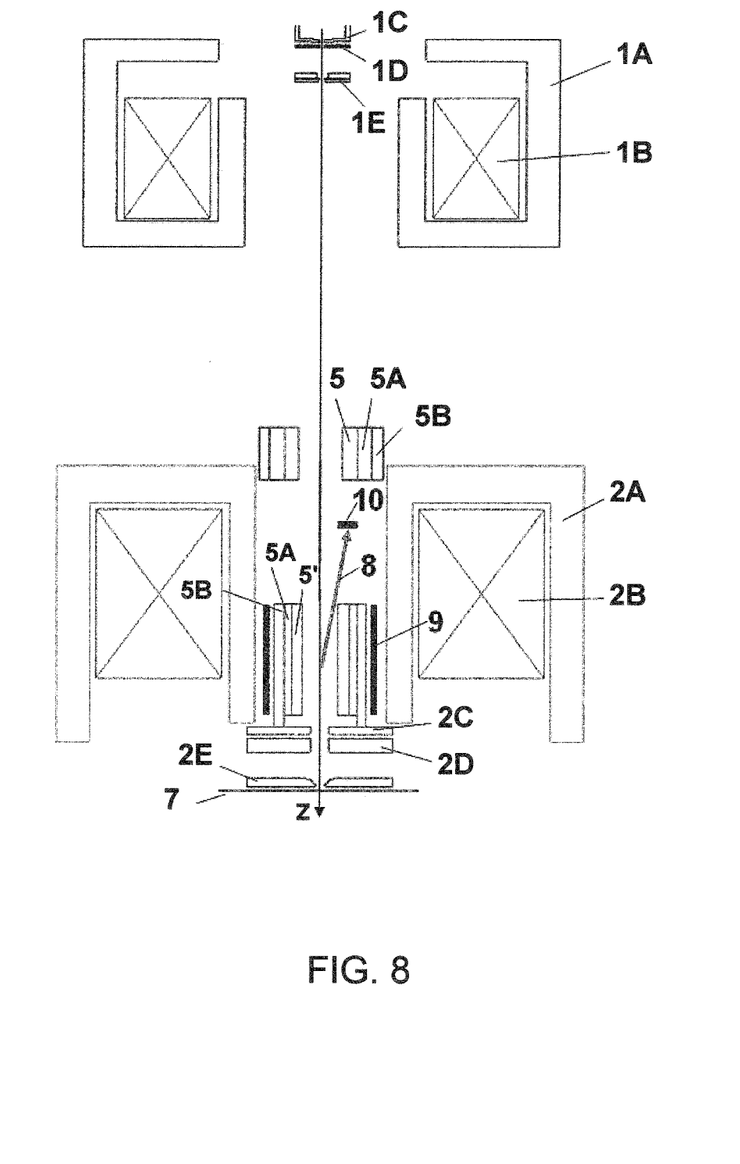
FIG. 8 is a cross-sectional diagram depicting select components of the electron beam column of a FEB image-forming instrument in accordance with an alternate embodiment of the invention.

In comparison to the apparatus of FIG. 2, the apparatus of FIG. 8 uses a first 12-pole electrostatic deflector (5) as a pre-scanning deflector and a second 12-pole electrostatic deflector (5') as a main scanning deflector. Each of the two 12-pole electrostatic deflectors (5 and 5') may be configured as described above in relation to FIG. 5.

Figure 9:
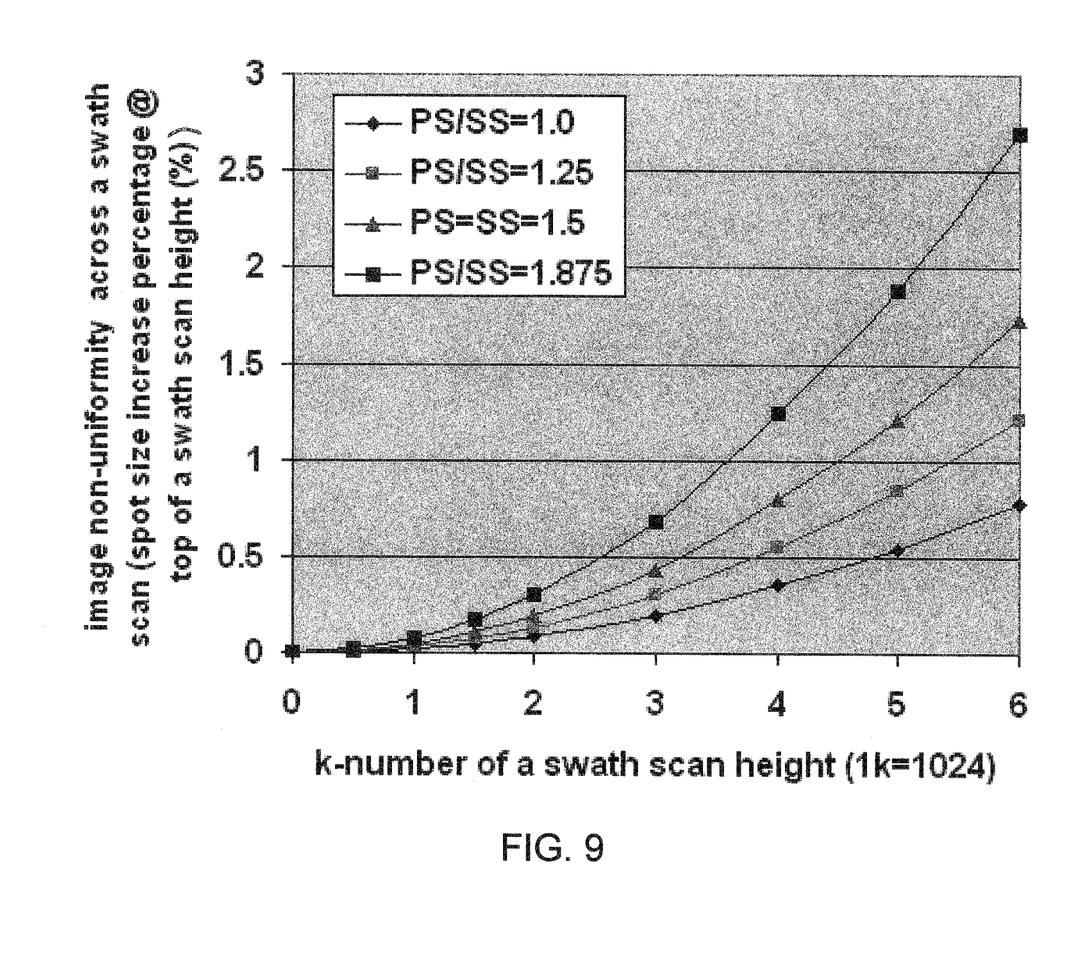
FIG. 9 is graph showing image non-uniformity data based on electron-beam simulations for the apparatus depicted in FIG. 8.

FIG. 9 is graph showing image non-uniformity data based on electron-beam simulations for the apparatus depicted in FIG. 8. In other words, the simulations results of FIG. 9 are based on an apparatus which uses a first 12-pole electrostatic deflector for a pre-scanner and a second 12-pole electrostatic deflector for main scanner.

Similar to FIG. 7, the image non-uniformity data is presented in FIG. 9 assuming four ratios of Pixel_Size (PS) over Spot_Size (SS): PS/SS=1.0; PS/SS=1.25; PS/SS=1.5; and PS/SS=1.875. For each ratio PS/SS, the percent increase in spot size from the field center (center of the FOV) to the top edge of a swath scan is plotted for swath scans with various swath scan heights.

As seen in the data of FIG. 9, the spot size increase across a swath scan is limited to less than three percent. Comparing FIG. 9 to FIG. 7, it is seen that the spot size increase is somewhat smaller in FIG. 9 than in FIG. 7.

Both FIGS. 7 and 9 show remarkable improvement in image uniformity compared to a conventional apparatus. The conventional apparatus may be configured, for example, with a quadrupole electrostatic deflector for a prescanner and an octopole electrostatic deflector for a main scanner. The image non-uniformity data for such a conventional apparatus is shown in FIG. 10.

Figure 10:
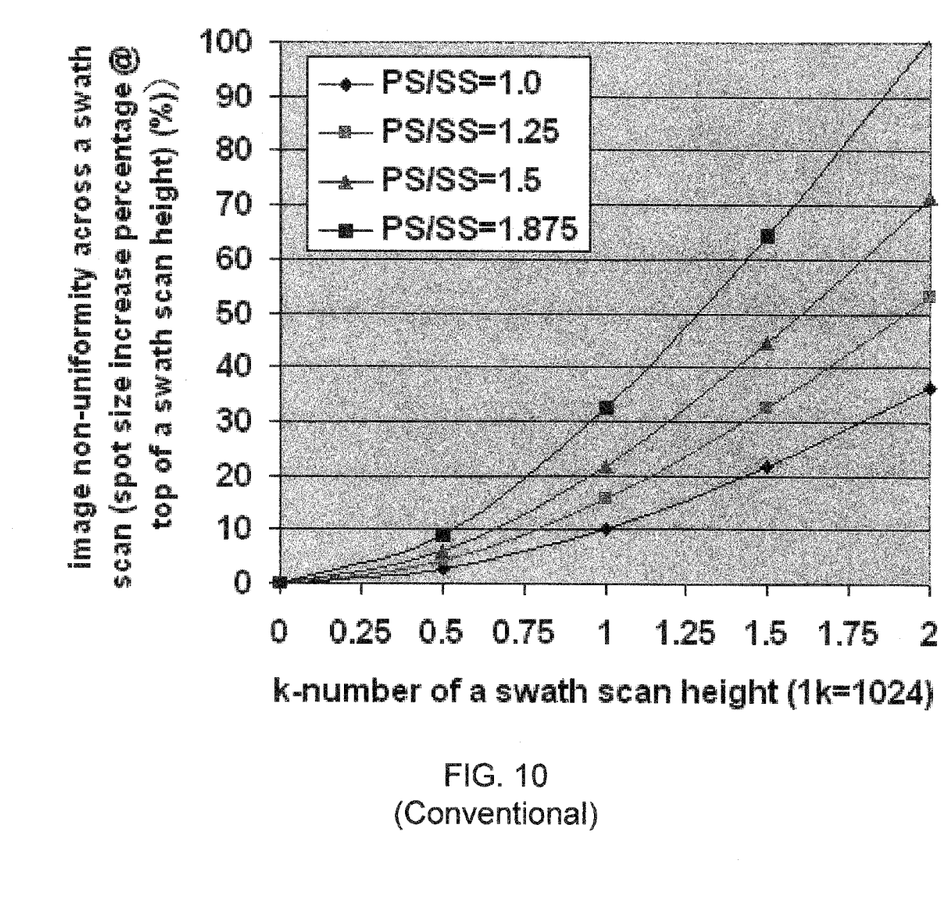
FIG. 10 is graph showing image non-uniformity data based on electron-beam simulations for a conventional apparatus.

As seen in the data of FIG. 10, the spot size increase across a swath scan is more than an order of magnitude greater and may be several tens of percent or more. Comparing FIG. 10 to FIGS. 7 and 9, it is seen that the spot size increase is much smaller in both FIGS. 7 and 9 compared with FIG. 10.

The above describes embodiments which utilize one or two 12-pole deflectors in a FEB instrument. Alternate embodiments may substitute a 20-pole deflector or a 28-pole deflector for any of the 12-pole deflectors. Design parameters for such 20-pole and 28-pole deflectors are provided below in Table 1.

TABLE 1

| Condition: $\delta = 2°$ | 12-pole deflector | 20-pole deflector | 28-pole deflector |
|---|---|---|---|
| Deflector plate angles to the center (degree) | $\alpha_1 = 23.0$<br>$\alpha_2 = 16.0$ | $\alpha_1 = 9.7$,<br>$\alpha_2 = 19.6$<br>$\alpha_3 = 5.7$ | $\alpha_1 = 0.4$, $\alpha_2 = 19.3$<br>$\alpha_3 = 10.0$, $\alpha_4 = 1.4$ |
| Elimination of high order deflection fields | k = 3 | k = 3, 5 | k = 3, 5, 7 |
| Coefficient of deflection field | $\rho = 0.79$ | $\rho = 0.76$ | $\rho = 0.74$ |
| Driving power supplies required | | $\pm$Vx and $\pm$Vy | |

For each of the deflector designs in Table 1, a condition assumed is that the half gap angle $\delta=2$ degrees. Hence, the radial angle of each gap is 4 degrees.

For the 12-pole deflector, the plate angles are $\alpha_1=23.0$ degrees and $\alpha_2=16.0$ degrees. Hence, the radial angle spanned by the larger electrode plates is 46 degrees, and the radial angle spanned by the smaller electrode plates is 16 degrees. As shown in FIG. 5, each 90-degree quadrant of the 12-pole deflector may be divided into: a plate angle $\alpha_1$; a gap angle $2\delta$; a plate angle $\alpha_2$; a gap angle $2\delta$; a plate angle $\alpha_2$; a gap angle $2\delta$; and a plate angle $\alpha_1$. Hence, $2\alpha_1+2\alpha_2+\delta=90$ degrees.

For the 20-pole deflector, the plate angles are $\alpha_1=9.7$ degrees, $\alpha_2=19.6$ degrees, and $\alpha_3=5.7$ degrees. Each 90-degree quadrant of the 20-pole deflector may be divided into: a plate angle $\alpha_1$; a gap angle $2\delta$; a plate angle $\alpha_2$; a gap angle $2\delta$; a plate angle $\alpha_3$; a gap angle $2\delta$; a plate angle $\alpha_3$; a gap angle $2\delta$; a plate angle $\alpha_2$; a gap angle $2\delta$; and a plate angle $\alpha_1$. Hence, $2\alpha_1+2\alpha_2+2\alpha_3+10\delta=90$ degrees.

For the 28-pole deflector, the plate angles are $\alpha_1=0.4$ degrees, $\alpha_2=19.3$ degrees, $\alpha_3=10.0$ degrees, and $\alpha_3=1.4$ degrees. Each 90-degree quadrant of the 28-pole deflector may be divided into: a plate angle $\alpha_1$; a gap angle $2\delta$; a plate angle $\alpha_2$; a gap angle $2\delta$; a plate angle $\alpha_3$; a gap angle $2\delta$; a plate angle $\alpha_4$; a gap angle $2\delta$; a plate angle $\alpha_4$; a gap angle $2\delta$; a plate angle $\alpha_3$; a gap angle $2\delta$; a plate angle $\alpha_2$; a gap angle $2\delta$; and a plate angle $\alpha_1$. Hence, $2\alpha_1+2\alpha_2+2\alpha_3+2\alpha_4+14\delta=90$ degrees.

The above-described design of the 12-pole deflector eliminates the $3^{rd}$-order (k=3) aberrations. The above-described design of the 20-pole deflector eliminates the $3^{rd}$-order (k=3) and $5^{th}$-order (k=5) aberrations. The above-described design of the 28-pole deflector eliminates the $3^{rd}$-order (k=3), $5^{th}$-order (k=5), and $7^{th}$-order aberrations. The coefficient of deflection field is 0.79 for the 12-pole deflector, 0.76 for the 20-pole deflector, and 0.74 for the 28-pole deflector. The 20-pole and 28-pole deflectors may be configured to utilize the same driving power supplies ($\pm$Vx and $\pm$Vy) as used for the 12-pole deflector described above.

The solutions provided in the present disclosure generally utilize at least one multiple-pole electrostatic deflector which is configured as described above so as to eliminate at least third-order aberrations. As described above, a 12-pole, 20-pole, or 28-pole deflector may be arranged in particular configurations to provide deflection in the x and y directions without third-order aberrations. These solutions diverge substantially from conventional thinking in the pertinent technological art.

The conventional thinking for improving homogeneity of the deflection field is to increase the inner diameter of the quadrupole deflector. While this may be a correct approach in principle, applicant believes that such an approach is constrained in practice for state-of-the-art focused electron beam (FEB) instruments. In state-of-the-art FEB instruments, the electron-optical column length is commonly shrunk substantially, and the electron beam energy is typically boosted highly. By using a shorter column length and a higher energy beam, spot blur induced by electron-electron interaction may be reduced.

Applicant believes that, if the inner diameter of the quadrupole deflector is increased per the conventional approach while the column length remains short, then the deflection sensitivity of the deflector would be insufficient to meet the required specification of a state-of-the-art FEB instrument. On the other hand, if the column length is increased so as to provide for longer deflectors (to increase deflection sensitivity), then the electron-electron interactions would increase and result in degraded resolution (larger beam spot sizes) for the instrument. Therefore, applicant believes that the conventional approach will run into problems that are avoided by the solutions disclosed herein.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A focused electron beam imaging apparatus comprising:
an electron source configured to emit electrons;
a gun lens configured to focus the electrons into an electron beam which travels down an optical axis of the apparatus;
a pre-scanning deflector configured to controllably deflect the electron beam away from the optical axis, wherein the pre-scanning deflector comprises a 12-pole electrostatic deflector;
a main scanning deflector configured to controllably deflect the electron beam back towards the optical axis;
an objective lens configured to focus the electron beam onto a spot on a surface of a target substrate; and
a detector configured to detect scattered electrons from the surface of the target substrate,
wherein the 12-pole electrostatic deflector comprises
a first electrode plate configured to span a radial angle of $2\alpha_1$,
a first gap adjacent to the first electrode plate, the first gap spanning a radial angle of $2\delta$,
a second gap adjacent to the second electrode plate, the second gap spanning a radial angle of $2\delta$,
a third electrode adjacent to the second gap, the third electrode being configured to span a radial angle of $\alpha_2$, and
a third gap adjacent to the third electrode plate, the third gap spanning a radial angle of $2\delta$,
wherein together the first electrode plate, the first gap, the second electrode plate, the second gap, the third electrode plate, and the third gap span a radial angle of 90 degrees,
wherein $\alpha_1$=23 degrees, $\alpha_2$=16 degrees, and $\delta$=2 degrees.

2. A focused electron beam imaging apparatus comprising:
an electron source configured to emit electrons;
a gun lens configured to focus the electrons into an electron beam which travels down an optical axis of the apparatus;
a pre-scanning deflector configured to controllably deflect the electron beam away from the optical axis, wherein the pre-scanning deflector comprises a 12-pole electrostatic deflector;
a main scanning deflector configured to controllably deflect the electron beam back towards the optical axis;
an objective lens configured to focus the electron beam onto a spot on a surface of a target substrate; and
a detector configured to detect scattered electrons from the surface of the target substrate,
wherein the 12-pole electrostatic deflector comprises
a first electrode plate configured to span a radial angle of $2\alpha_1$,
a first gap adjacent to the first electrode plate, the first gap spanning a radial angle of $2\delta$,
a second electrode plate adjacent to the first gap, the second electrode plate being configured to span a radial angle of $\alpha_2$,
a second gap adjacent to the second electrode plate, the second gap spanning a radial angle of $2\delta$,
a third electrode plate adjacent to the second gap, the third electrode plate being configured to span a radial angle of $\alpha_2$,
a third gap adjacent to the third electrode plate, the third gap spanning a radial angle of $2\delta$,
a fourth electrode plate adjacent to the third gap, the fourth electrode plate being configured to span a radial angle of $2\alpha_1$,
a fourth gap adjacent to the fourth electrode plate, the fourth gap spanning a radial angle of $2\delta$,
a fifth electrode plate adjacent to the fourth gap, the fifth electrode plate being configured to span a radial angle of $\alpha_2$,
a fifth gap adjacent to the fifth electrode plate, the fifth gap spanning a radial angle of $2\delta$,
a sixth electrode plate adjacent to the fifth gap, the sixth electrode plate being configured to span a radial angle of $\alpha_2$,
a sixth gap adjacent to the sixth electrode plate, the sixth gap spanning a radial angle of $2\delta$,
a seventh electrode plate adjacent to the sixth gap, the seventh electrode plate being configured to span a radial angle of $2\alpha_1$,
an seventh gap adjacent to the seventh electrode plate, the seventh gap spanning a radial angle of $2\delta$,
an eighth electrode plate adjacent to the seventh gap, the eighth electrode plate being configured to span a radial angle of $\alpha_2$,
an eighth gap adjacent to the eighth electrode plate, the eighth gap spanning a radial angle of $2\delta$,
a ninth electrode plate adjacent to the eighth gap, the ninth electrode plate being configured to span a radial angle of $\alpha_2$,
a ninth gap adjacent to the ninth electrode plate, the ninth gap spanning a radial angle of $2\delta$,
a tenth electrode plate adjacent to the ninth gap, the tenth electrode plate being configured to span a radial angle of $2\alpha_1$,
a tenth gap adjacent to the tenth electrode plate, the tenth gap spanning a radial angle of $2\delta$,
an eleventh electrode plate adjacent to the tenth gap, the eleventh electrode plate being configured to span a radial angle of $\alpha_2$,
an eleventh gap adjacent to the eleventh electrode plate, the eleventh gap spanning a radial angle of $2\delta$,
a twelfth electrode plate adjacent to the eleventh gap, the twelfth electrode plate being configured to span a radial angle of $\alpha_2$, and
a twelfth gap adjacent to the twelfth electrode plate, the twelfth gap spanning a radial angle of $2\delta$,
wherein $\alpha_1$=23 degrees, $\alpha_2$=16 degrees, and $\delta$=2 degrees.

3. A twelve-pole electrostatic deflector comprising:
twelve electrode plates, including first, second, third, fourth, fifth, sixth, seventh, eighth, ninth, tenth, eleventh, and twelfth, electrode plates;
an insulator around a cylindrical volume, the axis of the cylindrical volume being the optical axis, wherein the twelve electrode plates are attached on a periphery of the cylindrical volume;
an open cylindrical space within the twelve electrode plates, the axis of the open cylindrical space being the optical axis;
wherein the first electrode plate is configured to span a first radial angle,
wherein a first gap is adjacent to the first electrode plate, the first gap spanning a gap radial angle,
wherein the second electrode plate is adjacent to the first gap, the second electrode plate being configured to span a second radial angle,
wherein a second gap is adjacent to the second electrode plate, the second gap spanning the gap radial angle,
wherein the third electrode plate is adjacent to the second gap, the third electrode plate being configured to span the second radial angle, wherein a third gap is adjacent to the third electrode plate, the third gap spanning the gap radial angle, wherein the fourth electrode plate is adjacent to the third gap, the fourth electrode plate being configured to span the first radial angle, wherein a fourth gap adjacent to the fourth electrode plate, the fourth gap spanning the gap radial angle, wherein the fifth electrode plate is adjacent to the fourth gap, the fifth electrode plate being configured to span the second radial angle, wherein a fifth gap is adjacent to the fifth electrode plate, the fifth gap spanning the gap radial angle, wherein the sixth electrode plate is adjacent to the fifth gap, the sixth electrode plate being configured to span the second radial angle, wherein a sixth gap is adjacent to the sixth electrode plate, the sixth gap spanning the gap radial angle, wherein the seventh electrode plate is adjacent to the sixth gap, the seventh electrode plate being configured to span the first radial angle, wherein an seventh gap is adjacent to the seventh electrode plate, the seventh gap spanning the gap radial angle, wherein the eighth electrode plate is adjacent to the seventh gap, the eighth electrode plate being configured to span the second radial angle, wherein an eighth gap is adjacent to the eighth electrode plate, the eighth gap spanning the gap radial angle, wherein the ninth electrode plate is adjacent to the eighth gap, the ninth electrode plate being configured to span the second radial angle, wherein a ninth gap adjacent to the ninth electrode plate, the ninth gap spanning the gap radial angle, wherein the tenth electrode plate is adjacent to the ninth gap, the tenth electrode plate being configured to span the first radial angle, wherein an tenth gap is adjacent to the tenth electrode plate, the tenth gap spanning the gap radial angle, wherein the eleventh electrode plate is adjacent to the tenth gap, the eleventh electrode plate being configured to span the second radial angle, wherein an eleventh gap is adjacent to the eleventh electrode plate, the eleventh gap spanning the gap radial angle, wherein the twelfth electrode plate is adjacent to the eleventh gap, the twelfth electrode plate being configured to span second radial angle, and wherein a twelfth gap is adjacent to the twelfth electrode plate, the twelfth gap spanning the gap radial angle, wherein the first radial angle is 46 degrees, the second radial angle is 16 degrees, and the gap radial angle is 4 degrees.

* * * * *